(12) United States Patent
Kim (10) Patent No.: US 7,218,954 B2
(45) Date of Patent: May 15, 2007

(54) LPA SHELF AND LPA TYPE SWITCHING METHOD FOR A MOBILE COMMUNICATION BASE STATION

(75) Inventor: Tae Wook Kim, Anyang-si (KR)

(73) Assignee: LG-Nortel Co., Ltd., Seoul (KR)

( * ) Notice: Subject to any disclaimer, the term of this patent is extended or adjusted under 35 U.S.C. 154(b) by 508 days.

(21) Appl. No.: 10/635,502

(22) Filed: Aug. 7, 2003

(65) Prior Publication Data

US 2004/0043750 A1 Mar. 4, 2004

(30) Foreign Application Priority Data

Aug. 27, 2002 (KR) ............................... 2002-50695

(51) Int. Cl.
*H04B 1/38* (2006.01)
(52) U.S. Cl. .................................... 455/561; 455/127.3
(58) Field of Classification Search ................ 455/561, 455/560, 114.3, 127.3, 550.1, 554.2, 275, 455/276.1, 304, 23, 42, 60
See application file for complete search history.

(56) References Cited

U.S. PATENT DOCUMENTS

| | | | |
|---|---|---|---|
| 6,094,097 A * | 7/2000 | Ke | 330/124 R |
| 6,895,230 B1 * | 5/2005 | Blount et al. | 455/276.1 |
| 6,996,379 B2 * | 2/2006 | Khorram | 455/91 |
| 2003/0058811 A1 * | 3/2003 | Shurvinton | 370/321 |
| 2004/0014500 A1 * | 1/2004 | Chun | 455/561 |

* cited by examiner

*Primary Examiner*—Edward F. Urban
*Assistant Examiner*—Tu X. Nguyen
(74) *Attorney, Agent, or Firm*—Ked & Associates, LLP (57) ABSTRACT

A linear power amplifier (LPA) shelf for a mobile communication base station including a plurality of LPA types installed in one LPA shelf. The LPA shelf includes a signal dividing unit and a signal combining unit, which can connect either a single path or multiple paths. The LPA shelf further includes a first LPA type conversion unit and a second LPA type conversion unit, which perform a switching operation so as to use one LPA of six LPAs as either a redundant LPA or an LPA that amplifies a gamma sector signal. Accordingly, since a plurality of LPA types can be supported with one LPA shelf, it is possible to prevent service from being stopped and prevent the waste of time, cost and human resources due to the replacement of equipment.

17 Claims, 5 Drawing Sheets

LPA SHELF AND LPA TYPE SWITCHING METHOD FOR A MOBILE COMMUNICATION BASE STATION

BACKGROUND OF THE INVENTION

1. Field of the Invention

The present invention relates to a mobile communication system, and more particularly, to a linear power amplifier (LPA) shelf in which a plurality of LPA types are supported with one LPA shelf according to each LPA installation and the number of frequency assignments (FAs) supported.

2. Background of the Related Art

Generally, a base station for a mobile communication system includes a LPA installed in a shelf. The LPA is used to amplify signals which are transmitted to subscribers on the basis of respective communication sectors.

Figure 1:
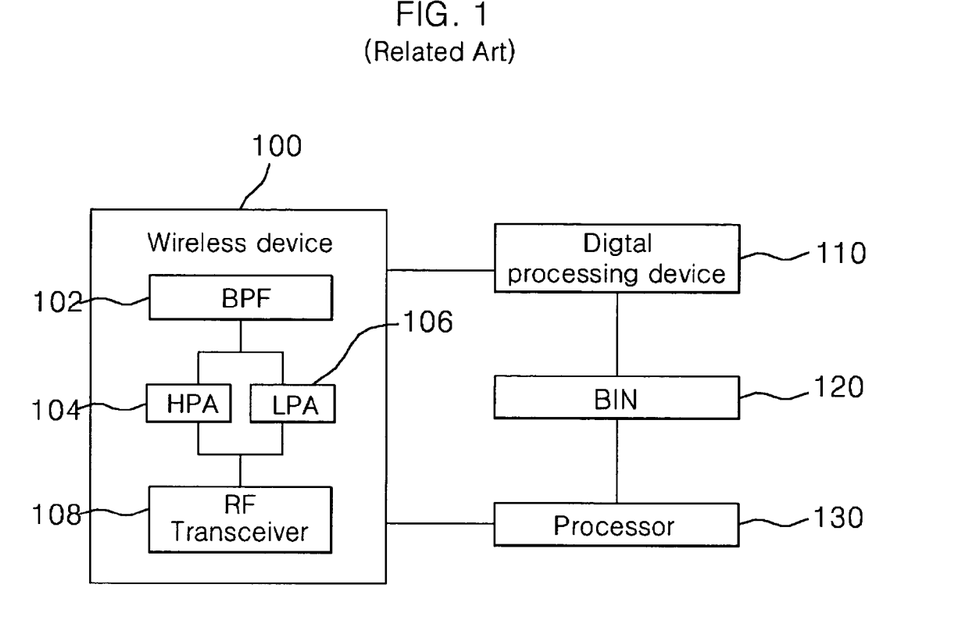
FIG. 1 is a view schematically illustrating a configuration of a related art base station for a related art mobile communication system.

FIG. 1 is a view schematically illustrating a configuration of a related art base station for a mobile communication system. Referring to FIG. 1, the base station includes a wireless device 100, a digital processing device 110, a BTS interconnection network (BIN) 120 and a processor 130.

The wireless device 100 processes a wireless signal for a wireless terminal. In other words, the wireless device 100 includes a band-pass filter (BPF) 102, a high power amplifier (HPA) 104, an LPA 106 and an RF transceiver 108. The wireless device 100 performs a common air interface (CAI) process, a wireless signal transmission/reception function, an RF signal up/down conversion function, an RF signal power amplification function and a wireless noise rejection function. The digital processing device 110 performs a channel coding/decoding related function, an interface function according to the sectors, and an analog common function for modulation/demodulation.

The BIN 120 routes packet data in the base station. In other words, the BIN 120 performs functions of routing and transmitting/receiving traffic information between the digital processing device 110 and a control station, as well as routing and transmitting/receiving control information between the processor 130 and the control station. The processor 130 controls the base station and functions to receive and divide TOD information of a global positioning system (GPS). According to the number of frequency assignments (FAs) and failure of LPA, 1:1 type, redundancy type and 2 way combiner type are respectively applied to an LPA shelf of the base station configured as discussed above.

Figure 2:
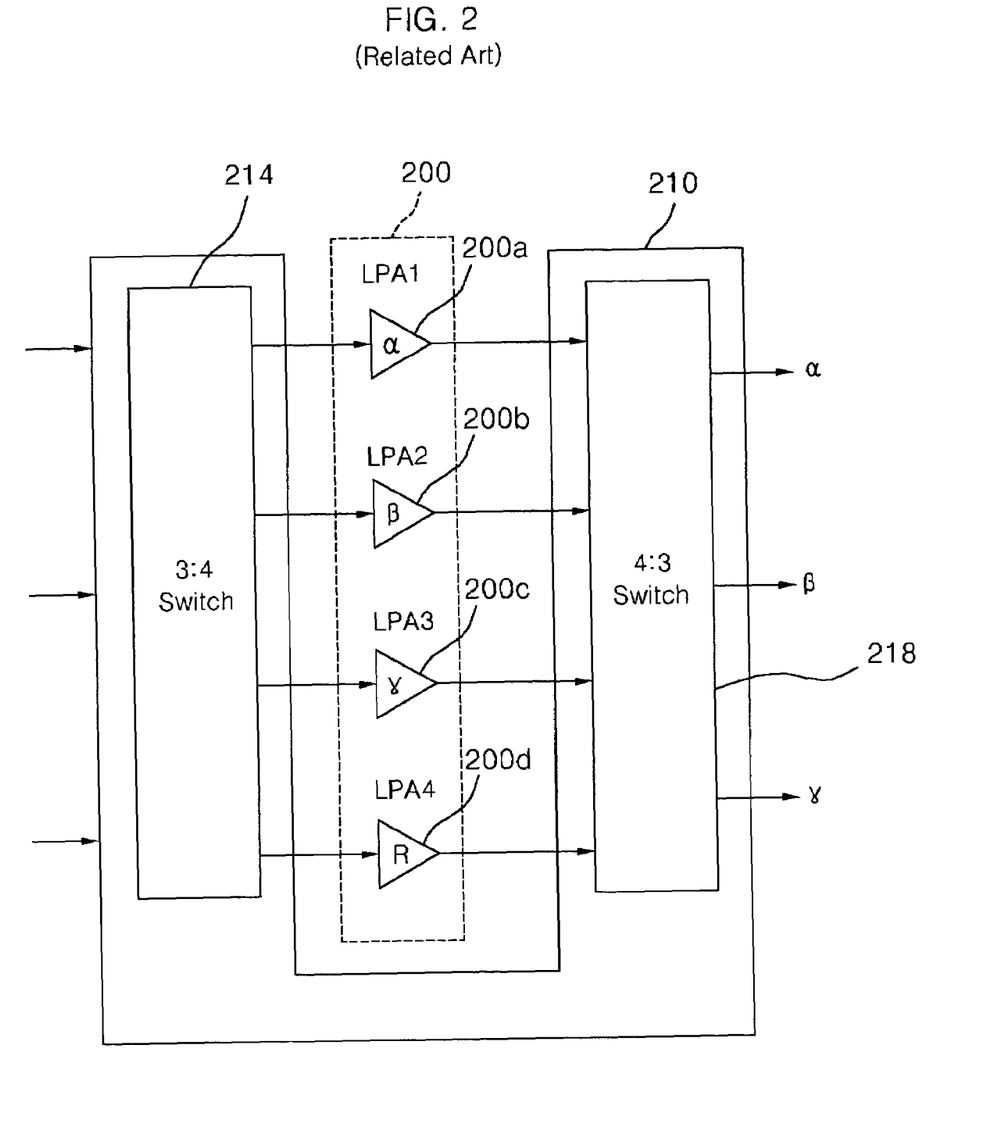
FIG. 2 is a view schematically illustrating a configuration of a related art LPA shelf of a redundancy LPA type.

FIG. 2 is a view schematically illustrating a configuration of a related art LPA shelf of a redundancy LPA type. Referring to FIG. 2, the LPA shelf to which the redundancy LPA type is applied comprises an LPA unit 200 and a switch unit 210. The switch unit 210 includes two switches 214 and 218 positioned at the front and back of the LPA unit 200.

The LPA unit 200 includes three LPAs (i.e., LPA1 200a, LPA2 200b and LPA3 200c) and a redundancy LPA (i.e., LPA4 200d). The redundancy LPA can be substituted for one abnormally performing LPA of the three LPAs 200a, 200b and 200c. When an LPA is performing abnormally, it is said to be in an abnormal state. Here, the LPA1, the LPA2 and the LPA3 cover an alpha sector, a beta sector and a gamma sector, respectively. In other words, signals to be transmitted to the alpha sector, the beta sector and the gamma sector are amplified by the LPA1 200a, the LPA2 200b, and the LPA3 2001c, respectively. If one of among the three LPAs 200a, 200b and 200c is in an abnormal state, the redundancy LPA, (i.e., LPA4 200d) is substituted for the abnormal LPA in order to maintain coverage.

For example, in case the LPA1 200a is in an abnormal state and cannot amplify signals to be transmitted to the alpha sector, the 3:4 switch 214 and the 4:3 switch 218 are switched from the LPA1 200a to the redundancy LPA4 200d. Accordingly, the signal to be transmitted to the alpha sector is inputted to the LPA4 200d and amplified to a predetermined level.

As described above and shown in FIG. 2, the switch unit 210 comprises the 3:4 switch 214 and the 4:3 switch 218. The 3:4 switch 214 is positioned at the front and back of the LPA unit 200 and inputs the signals for each sector to corresponding LPAs, and the 4:3 switch 218 switches the amplified signals outputted from the LPA unit 200 to transmit them to corresponding sectors. At this time, the switch unit 210 switches the signals to the LPA4 200d if the LPA for amplifying the signals for each sector is in the abnormal state.

Figure 3:
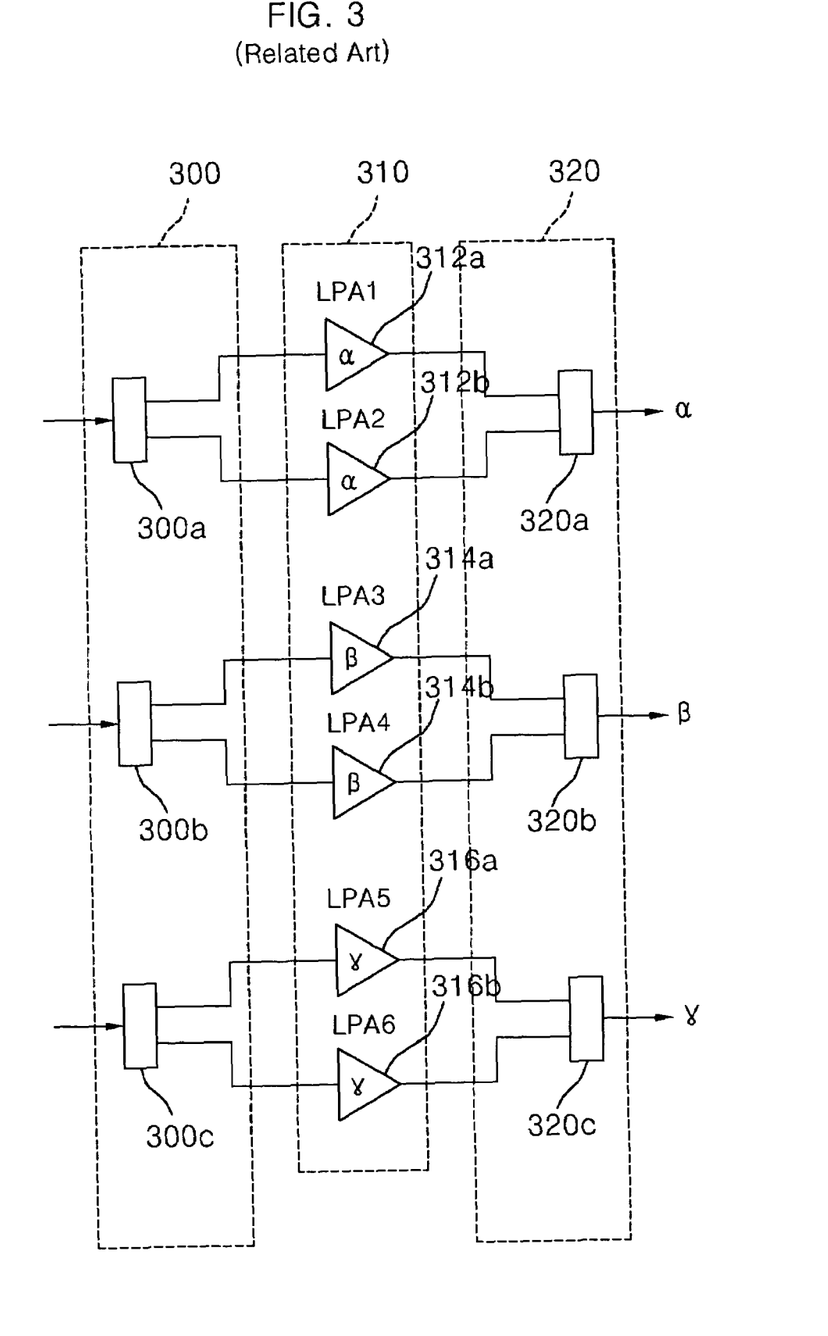
FIG. 3 is a view schematically illustrating a configuration of a related art LPA shelf of 2 way combiner type.

Generally, one LPA accommodates 2 FAs. If the subscriber capacity of the corresponding base station increases or the number of FAs increases to 3 or 4 due to the change of the external environment, the LPA shelf changes to a 2 way combiner type as shown in FIG. 3. In this case, the LPA shelf provided with the related art redundancy type should be removed from the base station and replaced with a LPA shelf of a 2 way combiner type.

FIG. 3 is a view schematically illustrating a configuration of the LPA shelf of a related art 2 way combiner type. Referring to FIG. 3, the LPA shelf of 2 way combiner type comprises a signal dividing unit 300, an LPA unit 310 and a signal combining unit 320.

The signal dividing unit 300 provides the signals for each sector to the corresponding LPAs, via paths divided into a first path and a second path. The signal dividing unit 300 includes a first signal divider 300a, a second signal divider 300b and a third signal divider 300c. Signals that are to be transmitted to an alpha sector, a beta sector and a gamma sector are inputted to the first signal divider 300a, the second signal divider 300b and the third signal divider 300c, respectively. Each of the signal dividers 300a, 300b and 300c comprises an internal switch for separately providing the signals via at least two divided paths.

In the LPA unit 310, each of the alpha, beta and gamma sectors are provided with two LPAs. In other words, the LPA unit 310 comprises an LPA1 312a and an LPA2 312b for amplifying the signal to be transmitted to the alpha sector, an LPA3 314a and an LPA4 314b for amplifying the signal to be transmitted to the beta sector and an LPA5 316a and an LPA6 316b for amplifying the signal to be transmitted to the gamma sector. From the above description and considering that the LPA shelf of 2 way combiner type used in case the subscriber capacity increases and the number of FAs is 3 or 4, those skilled in the art will understand that two LPAs covering each sector are provided with respect to each sector.

The signal combining unit 320 combines the amplified signals according to the sectors. The signal combining unit 320 receives the amplified signals via two paths for each sector and combines two amplified signals provided by the corresponding two LPAs into one signal. The signal combining unit 320 includes a first signal combiner 320a, a second signal combiner 320b, and a third signal combiner 320c, which are used to combine each sector signal.

For example, in an exemplary embodiment where an output signal of the alpha sector is 60 watts and the number of allocated FAs is two, the LPA shelf of the redundancy type accommodates 30 watts per one FA. In the LPA shelf of the 2 way combiner type shown in FIG. 3, at least 3 FAs should be allocated. If the number of allocated FAs is 4, the LPA shelf of the 2 way combiner type accommodates 15 watt per one FA. When the first signal divider 300a receives the signals to be transmitted to the alpha sector, gains of the signals each of which has 15 watts (W) are amplified via two paths by the LPA1 312a and LPA2 312b and then combined using a phase combination method by the first signal combiner 320a, thereby outputting signals with a total of 30 W.

If either the LPA1 312a or the LPA2 312b changes to an abnormal state in the LPA shelf of the 2 way combiner type, the signal dividing unit 300 and the signal combining unit 320 can disconnect the corresponding paths, so that the loss due to signal division and signal combination is prevented. While an entire gain is maintained constantly, the output per FA decreases to half the gain. Accordingly, although service areas according to the FAs of sectors are reduced, the service is not stopped, so that the redundancy LPA, shown in FIG. 2, for preventing the service from being stopped is not required.

However, since the related LPA shelf itself is configured to be adaptable to respective LPA types, the LPA shelf must be removed from the base station and another LPA shelf must be substituted for the LPA shelf whenever an external situation occurs.

In addition, in the prior art, since the base station should be turned off so as to substitute the LPA shelf, the service is stopped for a long time until the LPA shelf is replaced completely. There is also a loss of manpower due to the physical replacement of the LPA shelf.

SUMMARY OF THE INVENTION

An object of the invention is to solve at least the above problems and/or disadvantages and to provide at least the advantages described hereinafter.

Accordingly, the present invention is directed to an LPA shelf and LPA type switching method for a mobile communication base station that substantially obviates one or more problems due to limitations and disadvantages of the related art.

An object of the present invention is to provide an LPA shelf for a mobile communication base station, capable of supporting a plurality of all LPA types with one LPA shelf.

Another object of the present invention is to provide a method of managing an LPA shelf according to an external situation.

Further another object of the present invention is to provide a method for switching LPA type from one LPA type to another LPA type according to an external situation in an LPA shelf.

To achieve these objects and other advantages and in accordance with the purpose of the invention, as embodied and broadly described herein, an LPA shelf for a mobile communication base station controls a path of at least one sector signal according to LPA types determined by LPA installation and the number of frequency assignments (FAs), provides the at least one sector signal to corresponding LPAs via the controlled path, and amplifies the at least one sector signal to a predetermined level to output the at least one amplified sector signal.

In another aspect of the present invention, an LPA shelf for a mobile communication base station comprises: a signal dividing means for setting paths of at least one sector signal received according to LPA types determined by LPA installation and the number of FAs, the signal dividing means including a first signal divider, a second signal divider and a third signal divider; a first switch means connected to the signal dividing means, for switching a first sector signal provided via a first path of the set paths to a corresponding LPA; a phase adjusting means connected to the first and second signal dividers, for adjusting a phase of a second sector signal so as to correspond to the first sector signal, the second sector signal being provided via a second path of the set paths; a first LPA type conversion means connected to the third signal divider and the first switch means, for converting the LPA type; a LPA means connected to the first switch means, the phase adjusting means and the first LPA type conversion means, for amplifying at least one sector signal provided from the first switch means, the phase adjusting means and the first LPA type conversion means to a predetermined level; a second switch means connected to the LPA means, for switching to operate together the first switch unit; a second LPA type conversion means connected to the LPA means, for switching to operate together the first LPA type conversion means; and a signal combining means connected to the LPA means and the second LPA type conversion means, for combining the at least one sector signal amplified by the LPA means according to respective sectors.

In another aspect of the present invention, the LPA installation is recognized by open collector signals generated from the respective LPAs. The LPA type is any one selected from the group consisting of a 1:1 type, a redundancy type and a 2 way combiner type. The signal dividing means and the signal combining means connect the first path and disconnect the second path if the LPA type is of a 1:1 type or a redundancy type. The signal dividing means and the signal combining means simultaneously connect the first path and the second path if the LPA type is a 2 way combiner type.

The phase adjusting means delays the phase of the second sector signal transmitted to the second path by an amount of delayed phase caused when the first sector signal passes through the first and second switch means. If the determined LPA type is a redundancy type, the LPA means comprises three LPAs and a redundancy LPA, the three LPAs corresponding to the respective sectors, the redundancy LPA being substituted for an abnormal LPA of the three LPAs. If the determined LPA type is a 2 way combiner type, the LPA means comprises six LPAs having two LPAs corresponding to the sector signals inputted via two paths per each sector.

The first LPA type conversion means is switched to either the signal dividing means or the first switch means according to the determined LPA type. The second LPA type conversion means is switched to either the signal combining means or the second switch means according to the determined LPA type.

In another aspect of the present invention, a method for managing an LPA shelf for a mobile communication base station comprises the steps of: (a) setting paths of at least one sector signal received according to LPA types determined by LPA installation and the number of FAs; (b) switching a first sector signal provided via a first path of the set paths to a corresponding LPA; (c) adjusting a phase of a second sector signal so as to correspond to the first sector signal, the second sector signal being provided via a second path of the set paths; (d) amplifying at least one sector signal provided via either the first path or the second path to a predetermined level; (e) switching the at least one amplified sector signal; and (f) combining the at least one amplified sector signal according to the sectors.

The method further comprises the steps of: (g) determining a current LPA type according to the LPA installation; and (h) determining a to-be-changed LPA type based on the current LPA type and the number of the FAs. If the LPA type is a 1:1 type and a redundancy type, the path of the at least one sector signal is set to only the first path. If the LPA type is a 2 way combiner type, the path of the at least one sector signal is simultaneously set to the first and second paths.

A method for switching LPA type of a mobile communication base station comprises the steps of: (a) determining a to-be-changed LPA type based on a current LPA type and the number of FAs according to open collector signals generated from each LPA; and (b) switching the LPA type according to the determined LPA type.

The method for switching the LPA type of the mobile communication base station further comprises the steps of: (c) if the current LPA type is a redundancy type and simultaneously 3 or more FAs are required so that the redundancy type is to be switched to a 2 way combiner type, simultaneously connecting first and second paths of a signal dividing means; (d) simultaneously connecting a second path of a first LPA type conversion means and a second path of a second LPA type conversion means, respectively; and (e) simultaneously connecting first and second paths of a signal combining means.

The method further comprises the steps of: (f) if the redundancy type is switched to the 2 way combiner type, delaying a phase of a second sector signal transmitted to the second path by an amount of delayed phase caused when a first sector signal passes through first and second switch means.

The method further comprises the steps of: (g) if the present LPA type is a 2 way combiner type and simultaneously 3 or less FAs are required so that the 2 way combiner type is to be switched to a redundancy type, connecting a first path of a signal dividing means and disconnecting a second path of a signal dividing means; (h) connecting a first path of a first LPA type conversion means and a first path of a second LPA type conversion means, respectively; and (i) connecting a first path of a signal combining means and disconnecting a second path of a signal combining means.

The method further comprises the steps of: (j) if the current type is a redundancy type and simultaneously the open collector signals are not received from a redundancy LPA so that the redundancy type is switched to a 1:1 type, connecting a first path of a signal dividing means and disconnecting a second path of a signal dividing means; (k) connecting a second path of a first LPA type conversion means and a second path of a second LPA type conversion means, respectively; and (l) connecting a first path of a signal combining means and disconnecting a second path of a signal combining means. The open collector signals are generated whenever each LPA is installed.

In another aspect of the present invention, an amplifier shelf for a mobile communication base station, the amplifier shelf comprises a signal that sets paths of at least one sector signal received according to amplifier characteristics and the signal includes a first signal divider, a second signal divider, and a third signal divider. A first switch coupled to the signal that switches a first sector signal provided via a first path of set paths to a corresponding amplifier. A phase adjuster coupled to the first and second signal dividers, that adjusts a phase of a second sector signal so as to correspond to the first sector signal, the second sector signal being provided via a second path of the set paths. A first amplifier type converter coupled to the third signal divider and the first switch that converts the amplifier type. An amplifier coupled to the first switch, the phase adjuster and the first amplifier type converter that amplifies at least one sector signal provided from the first switch, the phase adjuster and the first amplifier type converter to a predetermined level. A second switch coupled to the amplifier that switches to operate together the first switch. A second amplifier type converter coupled to the amplifier that switches to operate together the first amplifier type converter; and a signal combiner coupled to the amplifier and the second amplifier type converter that combines the at least one sector signal amplified by the amplifier according to respective sectors.

Additional advantages, objects, and features of the invention will be set forth in part in the description which follows and in part will become apparent to those having ordinary skill in the art upon examination of the following or may be learned from practice of the invention. The objects and advantages of the invention may be realized and attained as particularly pointed out in the appended claims.

BRIEF DESCRIPTION OF THE DRAWINGS

The invention will be described in detail with reference to the following drawings in which like reference numerals refer to like elements wherein.

DETAILED DESCRIPTION OF PREFERRED EMBODIMENTS

Figure 4:
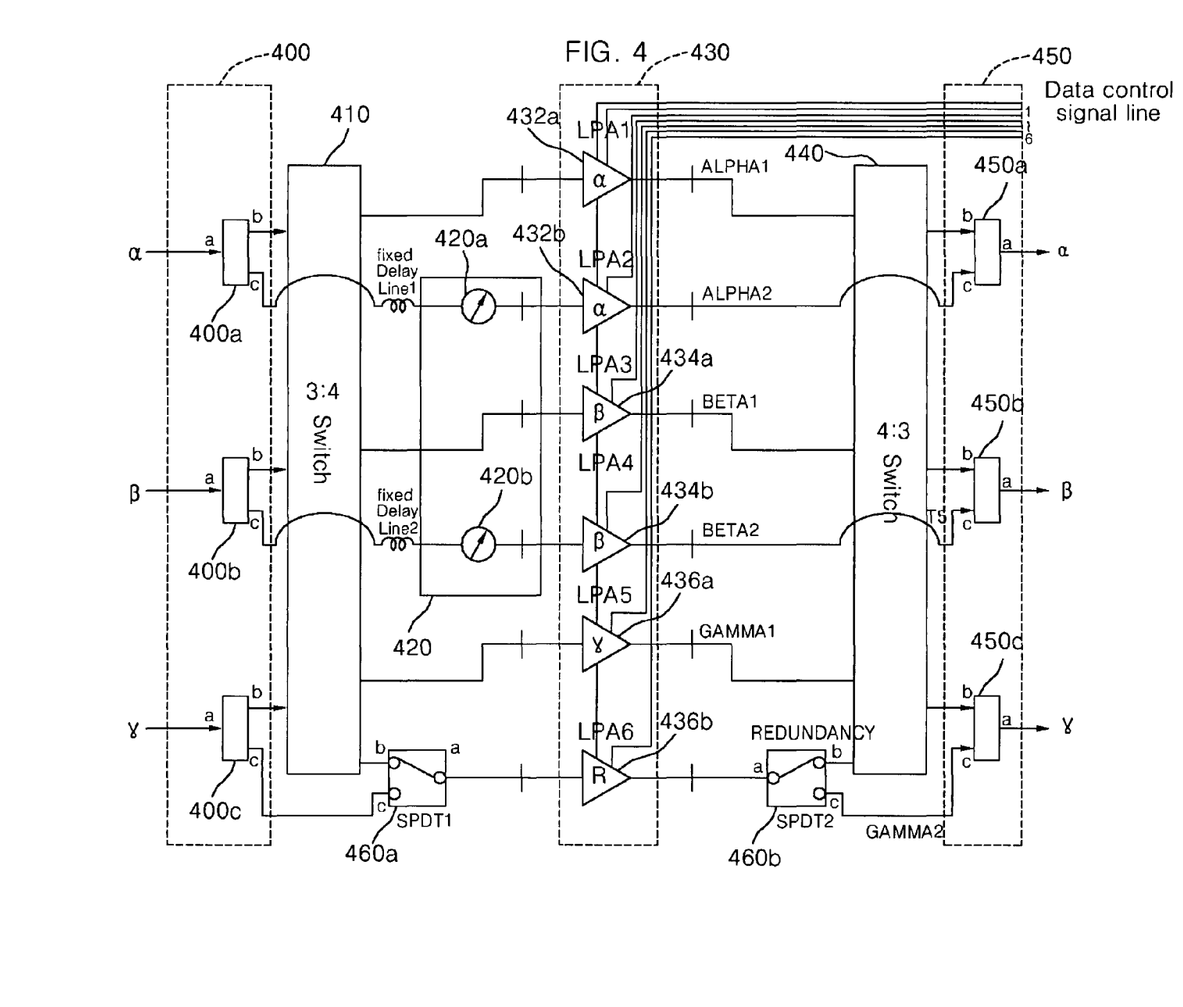
FIG. 4 illustrates an exemplary configuration of an LPA shelf for a mobile communication base station in accordance with a preferred embodiment of the present invention, in which the LPA shelf can support a plurality of LPA types.

FIG. 4 illustrates an exemplary configuration of an LPA shelf for a mobile communication base station in accordance with an exemplary embodiment of the present invention, in which the LPA shelf can support a plurality of LPA types. Referring to FIG. 4, the LPA shelf can include a signal dividing unit 400, a first switch unit 410, a LPA unit 430, a second switch unit 440, a signal combining unit 450, a phase adjusting unit 420, a first LPA type conversion unit 460a and a second LPA type conversion unit 460b. In this exemplary embodiment, the first switch unit 410 is provided with a 3:4 switch and the second switch unit 440 is provided with a 4:3 switch. Also, the first LPA type conversion unit 460a is provided with an SPDT1 (Single Port Double Terminal) and the second LPA type conversion unit 460b is provided with an SPDT2.

The signal dividing unit 400 includes a first signal divider, a second signal divider and a third signal divider, which receive three sector signals, i.e., an alpha sector signal, a beta sector signal and a gamma sector signal, respectively. Here, the first, second and third signal dividers are depicted by 400a, 400b and 400c, respectively. The first signal divider, the second signal divider and the third signal divider have internal switches within them and set a first path and a second path.

The first path is a path a-b, and the second path is a path a-c. According to the LPA types, the signal dividing unit 400 may simultaneously connect the first and second paths or may connect the first path and disconnect the second path. In other words, if the LPA type is the 1:1 type or the redundancy type, the first path is connected and the second path is disconnected. Meanwhile, if the LPA type is the 2 way combiner type, the first path and the second path are connected at the same time. Those skilled in the art will realize that these connections may be made physically (e.g. wire) or they may be wireless (e.g. radio communications), without departing from the spirit and scope of the claimed invention.

The 3:4 switch 410 is connected to each of the first paths (i.e., the paths a-b) of the first, second and third signal dividers 400a, 400b 400c and switches to provide the LPA unit 430 with the first sector signals transmitted via the first paths. The phase adjusting unit 420 is connected to the second paths (i.e., the paths a-c) of the first and second signal dividers 400a and 400b and includes first and second phase adjusters 420a and 420b. The phase adjusting unit 420 delays the phases of the second sector signals provided via the second paths by an amount of delayed phase which is caused while the first sector signals provided via the first paths are passing through the 3:4 switch 410 and the 4:3 switch 440.

Accordingly, the first and second sector signals inputted to the signal combining unit 450 maintain the same phase. The phases of the first and second sector signals are identically maintained (or maintained within a prescribed range) so as to maximally enhance the outputs of the sector signals outputted from the signal combining unit 450 when the signal combining unit combines the signals using the phase combination method.

In this exemplary embodiment, it should be noted that the phase adjusting unit 420 is not connected to the second path of the third signal divider 400c. Instead, the SPDT1 460a is connected to the second path of the third signal divider 400c. The time for which the first sector signal provided via the first path passes through the 3:4 switch 410 is almost identical to that for which the second sector signal provided via the second path passes through the SPDT1 460a. Therefore, since the phases of the sector signals are identical to each other (or so small as to not require any additional phase compensation, it is unnecessary to install an additional phase adjusting unit in the second path.

The SPDT1 460a is connected to the third signal divider 400c and the 3:4 switch 410 and connects the first path (i.e., the path b-a) and the second path (i.e., the path c-a) according to LPA types. In other words, if the LPA type is the redundancy type, the first path of the SPDT1 460a is connected. If the LPA type is the 1:1 type or the 2 way combiner type, the second path of the SPDT1 460a is connected.

The LPA unit 430 amplifies the sector signals provided according to each LPA type. The LPA unit 430 includes six LPAs, i.e., an LPA1 432a, an LPA2 432b, an LPA3 434a, an LPA4 434b, an LPA5 436a and an LPA6 436b. In this exemplary embodiment, the LPA1 432a and the LPA2 432b amplify the alpha sector signal and the LPA3 434a and the LPA4 434b amplify the beta sector signal. The LPA5 436a amplifies the gamma sector signal. In addition, the LPA6 436b amplifies corresponding sector signals instead of other LPAs in an emergency if the LPA type is the redundancy type. The LPA6 436b amplifies the gamma sector signal if the LPA type is the 2 way combiner type.

The LPA1 432a, the LPA3 434a and the LPA5 436a are connected to the 3:4 switch 410, and the LPA2 432b and the LPA4 434b are connected to the phase adjusting unit 420. The LPA6 436b is connected to the SPDT1 460a.

Additionally, the respective LPAs 432a, 432b, 434a, 434b, 436a and 436b contained in the LPA unit 430 may include their own processors. The respective LPAs generate an open collector signal and provide it to an upper block (e.g., the controller of the base station) via a control signal line.

The 4:3 switch 440 performs a switching operation to allow the sector signals amplified by the LPA unit 430 to provide them to the signal combiner 450. The 4:3 switch 440 is connected to the LPA1 432a, the LPA3 434a and the LPA5 436a.

The SPDT2 460b has a front end (terminal a) connected to the LPA6 436b and a rear end (terminals b and c) connected to the 4:3 switch 440 and the third signal combiner 450c of the signal combining unit 400. In the same manner as the SPDT1 460a, the SPDT2 460b also connects the first path a-b and the second path a-c according to the LPA types. In other words, if the LPA type is the redundancy type, the first path of the SPDT2 460b is connected. If the LPA type is the 1:1 type or the 2 way combiner type, the second path of the SPDT2 460b is connected.

The signal combining unit 450 includes a first signal combiner 450a, a second signal combiner 450b and a third signal combiner 450c. The signal combining unit 450 combines the first sector signals provided via the first path and the second sector signals provided via the second path using the phase combination method to thereby output one sector signal. This can be applied if the LPA type is 2 way combiner type. If the LPA type is the 1:1 type or the redundancy type, the sector signals are passed through only one path of two paths by the signal combining unit 450.

The first signal combiner 450a, the second signal combiner 450b and the third signal combiner 450c have internal switches, respectively. The respective paths are classified into first paths b-a and second paths c-a. Accordingly, each of the signal combiners 450a, 450b and 450c may connect either or both of the first and second paths.

The various exemplary methods of managing the LPA shelf configured as above will be described. First, if the LPA type is the redundancy type, the LPA2 432b and LPA4 434b are not operated. Accordingly, the signal dividing unit 400 connects the first paths of the signal dividers 400a, 400b and 400c while it disconnects the second paths thereof. Additionally, the signal combining unit 450 connects the first paths of the respective signal combiners 450a, 450b and 450c while it disconnects the second paths thereof. At this time, the SPDT1 460a and the SPDT2 460b connect the first paths to activate the redundancy LPA (i.e., the LPA6 436b).

The respective sector signals are input to the 3:4 switch 410 via the first paths of the signal dividers 400a, 400b and 400c. The 3:4 switch 410 switches to allow the respective sector signals to be provided to the corresponding LPAs. Here, the respective sector signals are inputted to any one of the LPA1 432a, the LPA3 434a and the LPA5 436a.

The LPA1 432a, the LPA3 434a and the LPA5 436a amplify the respective sector signals to a predetermined level and then provide the amplified sector signals to the 4:3 switch 440. The respective sector signals switched by the 4:3 switch 440 are outputted via the first paths of the signal combining unit 450.

If any one of the LPA1 432a, the LPA3 434a and the LPA5 436a is in an abnormal state, the 3:4 switch 410 and the 4:3 switch 440 change the previously connected paths to connect to the redundancy LPA (i.e., the LPA6 436b). If the LPA type is the 2 way combiner type, all of the LPA1 432a, the LPA2 432*b*, the LPA3 434*a*, the LPA4 434*b*, the LPA5 436*a* and the LPA6 436*b* are operated.

Accordingly, the signal dividing unit 400 connects the first paths and the second paths of the signal dividers 400*a*, 400*b* and 400*c* at the same time. The signal combining unit connects the first paths and the second paths of the signal combiners 450*a*, 450*b* and 450*c* at the same time. The SPDT1 460*a* and the SPDT2 460*b* make the LPA6 436*b* to be operated as an LPA for amplifying the gamma sector signal by connecting the second paths.

Thus, the respective sector signals are divided by the signal dividers 400*a*, 400*b* and 400*c* and provided via the first and second paths. The first and second sector signals provided via the first and second paths are amplified to a predetermined level by each of the LPAs 432*a*, 432*b*, 434*a*, 434*b*, 436*a* and 436*b*. The phases of the first sector signals provided via the first paths are delayed while the first and second sector signals pass through the 3:4 switch 410 and the 4:3 switch 440. To compensate for the delayed phases, the phase adjusting unit 420 delays the phases of the second sector signals provided via the second paths by an amount of the delayed phase of the first sector signals provided via the first paths.

The amplified first and second sector signals are transmitted to the signal combining unit 450 via the 4:3 switch 440 and the SPDT2 460*b*, or are directly transmitted to the signal combining unit 450. The signal combining unit 450 combines the first and second sector signals using the phase combination method to output one sector signal. An exemplary method of switching each LPA type in the LPA shelf for an exemplary mobile communication base station as configured above.

Figure 5:
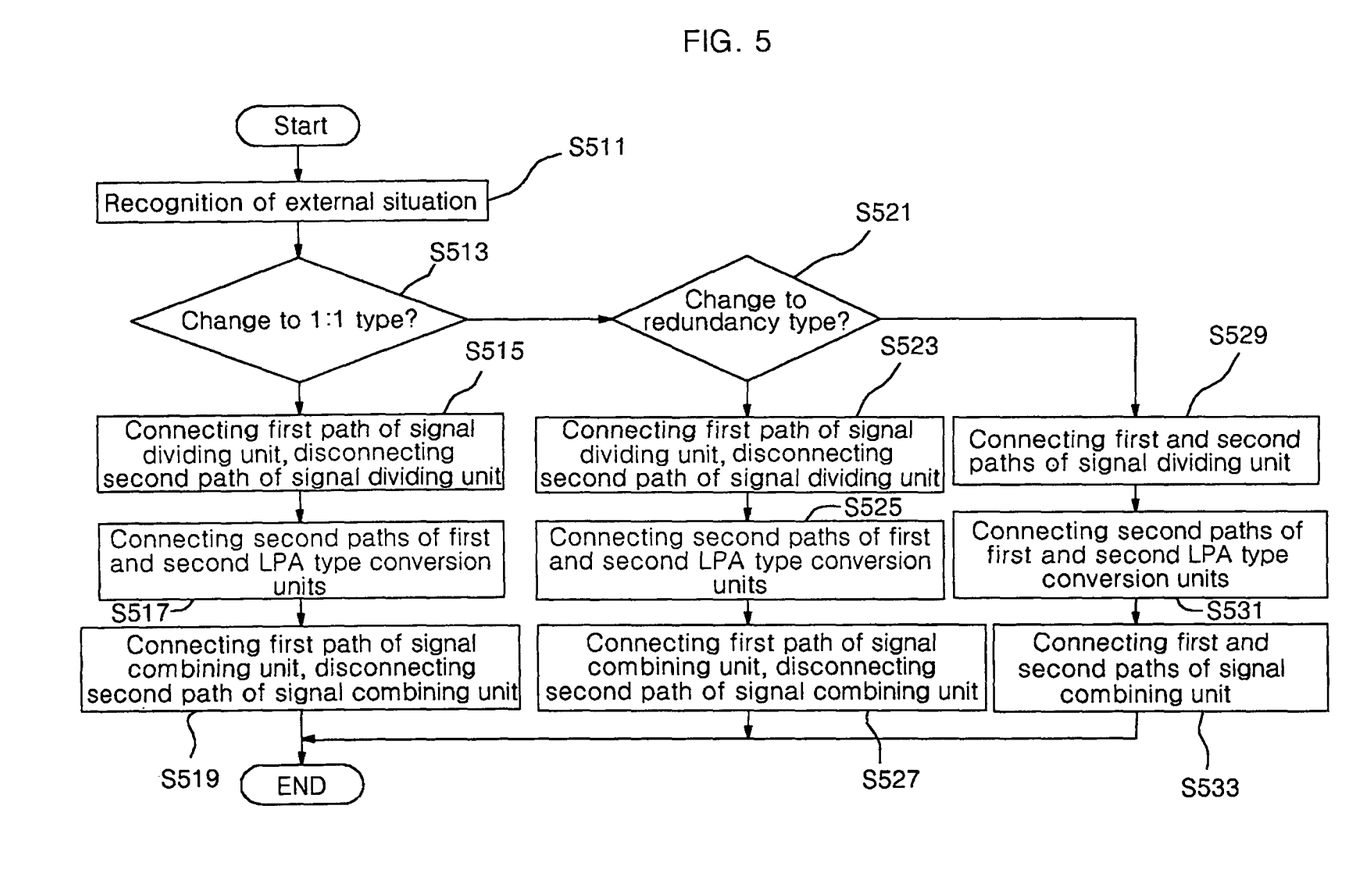
FIG. 5 is a flowchart illustrating an exemplary method of switching an LPA type to another LPA type in the LPA shelf for the mobile communication base station according to a preferred embodiment of the present invention.

FIG. 5 is a flowchart illustrating an exemplary method of switching one LPA type to other LPA types in the LPA shelf of an exemplary embodiment for a mobile communication base station. Referring to FIG. 5, an external situation is recognized (S511). The step S511 can be performed by the controller contained in the base station having the LPA shelf, although those skilled in the art will recognize that in other embodiments, step S511 may be performed in another controller within the system. An exemplary external situation may include an LPA installation and the number of FAs. As described in FIG. 4, each of the LPAs 432*a*, 432*b*, 434*a*, 434*b*, 436*a* and 436*b* includes its own processor. If each LPA is installed and is in a normal mode, an open collector signal is generated and provided to the upper block via the control signal line. The upper block may be a controller of the base station.

Accordingly, the current LPA type is determined based on the open collector signal provided from each LPA. For example, in one scenario, if the open collector signals are provided only from the LPA1, the LPA2 and the LPA3, the current LPA type is determined as the 1:1 type. In another scenario, if the open collector signals are provided from all of the LPA1 to LPA6, the current LPA type is determined as the 2 way combiner type. In another scenario, if the open collector signals are provided from the LPA1, the LPA3, the LPA5 and the LPA6, the current LPA type is determined as the redundancy type.

The controller of the base station can calculate the number of FAs by checking the subscriber capacity through a signal interchange with the wireless terminal. If the subscriber capacity increases with an increase of the subscribers, the controller of the base station increases the number of FAs. If the number of the FAs is 3 or more, the LPA type should be changed to the 2 way combiner type. Conversely, if the number of FAs is 3 or less, the LPA type should be changed to the 1:1 type or the redundancy type.

Considering the LPA installation and the number of the FAs, the LPA type that is to be changed is determined. When the LPA types are determined, the controller of the base station (or another controller in another location) may include the software for changing the LPA type to the determined LPA type according to the LPA types. If the current type of LPA is the redundancy type or the 1:1 type and 4 FAs are allocated due to an increase in the number of the FAs, the LPA type is changed to the 2 way combiner type. Also, if the current type is the 2 way combiner type and 2 FAs are allocated due to an decrease in the number of the FAs, the LPA type is changed to the redundancy type or the 1:1 type.

As a collective result of checking the recognized external situation, if the LPA type is to be changed to the 1:1 type, the software for changing the LPA type to the 1:1 type is executed (S513). In other words, the first paths of the signal dividing unit 400 are connected and the second paths of the signal dividing unit 400 are disconnected (S515).

In addition, the second paths of the SPDT1 460*a* and the SPDT2 460*b* are respectively connected (S517). Since the second paths of the SPDT1 460*a* and the SPDT2 460*b* are connected, the LPA6 436*b* (i.e., the redundant LPA) is not operated. At the same time, the first paths of the signal combining unit 450 are connected while the second paths are disconnected (S519). Accordingly, the sector signals are amplified by the corresponding LPAs according to the changed 1:1 type and the amplified sector signals are outputted. As the checking result of the step S513, if the LPA type is to be changed to the redundancy type, the software for changing the LPA type to the redundancy type is executed (S521).

Accordingly, the first paths of the signal dividing unit 400 are connected, while the second paths thereof are disconnected (S523). In addition, the first paths of the SPDT1 460*a* and the SPDT2 460*b* are respectively connected (S525). Since the first paths of the SPDT1 460*a* and the SPDT2 460*b* are connected, if any one of the LPA1 432*a*, the LPA3 434*a* and the LPA5 436*a* is operated in an abnormal state, the LPA6 436*b* of the redundancy type is operated instead of the abnormal LPA. At the same time, the first paths of the signal combining unit 450 are connected while the second paths thereof are disconnected (S527).

According to the changed redundancy type, the sector signals are input to the six LPAs 432*a*, 432*b*, 434*a*, 434*b*, 436*a* and 436*b* via the two paths and then amplified therein. The signal combining unit 450 combines the sector signals according to the sectors to output one sector signal according to the respective sectors. As the checking result of step S513, if the LPA type is to be changed to the 2 way combiner type due to an increase in the number of the FAs, the software for changing the LPA type to the 2 way combiner type is executed. Accordingly, the first and second paths of the signal dividing unit 400 are connected at the same time (S529). In addition, the second paths of the SPDT1 460*a* and the SPDT2 460*b* are connected (S531). Since the second paths of the SPDT1 460*a* and the SPDT2 460*b* are connected, the LPA6 436*b* is operated as an LPA for amplifying the gamma sector signal. The first and second paths of the signal combining unit 450 are connected at the same time (S533). As described above, the LPA type can be changed to the corresponding LPA type according to the LPA type determined based on the LPA installation and the number of the FAs.

According to an exemplary embodiment of the LPA shelf for the mobile communication base station, since a plurality of LPA types are all supported with one LPA shelf, the LPA type can be changed to the desired LPA type by connecting or disconnecting the corresponding LPAs without any degradation of performance caused when the LPA type is changed. In addition, it is unnecessary to replace the LPA shelf and the cost and the time required to replace the LPA shelf can be also reduced. This feature permits the waste of human resources to be effectively reduced.

Further, according to the LPA shelf for the mobile communication base station of the present invention, when increasing the number of the FAs and changing the LPA configuration in the base station according to a wireless environment, the loss or risk, which is caused when the service is stopped so as to change the LPA shelf, can be minimized, so that the base station can be managed in a flexible manner.

It will be apparent to those skilled in the art that various modifications and variations can be made in the present invention. Thus, it is intended that the present invention covers the modifications and variations of this invention provided they come within the scope of the appended claims and their equivalents.

The foregoing embodiments and advantages are merely exemplary and are not to be construed as limiting the present invention. The present teaching can be readily applied to other types of apparatuses. The description of the present invention is intended to be illustrative, and not to limit the scope of the claims. Many alternatives, modifications, and variations will be apparent to those skilled in the art. In the claims, means-plus-function clauses are intended to cover the structures described herein as performing the recited function and not only structural equivalents but also equivalent structures.

What is claimed is:

1. A linear power amplifier (LPA) shelf for a mobile communication base station, the LPA shelf comprising:
   a signal dividing means that sets paths of at least one sector signal received according to LPA types determined by LPA installation and a number of frequency assignments (FAs), the signal dividing means including a first signal divider, a second signal divider and a third signal divider;
   a first switch means connected to the signal dividing means, that switches a first sector signal provided via a first path of set paths to a corresponding LPA;
   a phase adjusting means connected to the first and second signal dividers, that adjusts a phase of a second sector signal so as to correspond to the first sector signal, the second sector signal being provided via a second path of the set paths;
   a first LPA type conversion means connected to the third signal divider and the first switch means, that converts the LPA type;
   an LPA means connected to the first switch means, the phase adjusting means and the first LPA type conversion means, that amplifies at least one sector signal provided from the first switch means, the phase adjusting means and the first LPA type conversion means to a predetermined level;
   a second switch means connected to the LPA means, that switches to operate together the first switch means;
   a second LPA type conversion means connected to the LPA means, that switches to operate together the first LPA type conversion means; and
   a signal combining means connected to the LPA means and the second LPA type conversion means, that combines the at least one sector signal amplified by the LPA means according to respective sectors.

2. The LPA shelf according to claim 1, wherein the LPA installation is recognized by open collector signals generated from the respective LPAs.

3. The LPA shelf according to claim 1, wherein the LPA type is any one selected from the group consisting of a 1:1 type, a redundancy type and a 2 way combiner type.

4. The LPA shelf according to claim 1, wherein the signal dividing means and the signal combining means connect the first path and disconnect the second path if the LPA type is of a 1:1 type or a redundancy type.

5. The LPA shelf according to claim 1, wherein the signal dividing means and the signal combining means connect the first path and the second path if the LPA type is a 2 way combiner type.

6. The LPA shelf according to claim 1, wherein the phase adjusting means delays the phase of the second sector signal transmitted to the second path by an amount of delayed phase caused when the first sector signal passes through the first and second switch means.

7. The LPA shelf according to claim 1, wherein, if the determined LPA type is a redundancy type, the LPA means comprises three LPAs and a redundancy LPA, the three LPAs corresponding to the respective sectors, the redundancy LPA being substituted for an abnormal LPA of the three LPAs.

8. The LPA shelf according to claim 1, wherein, if the determined LPA type is a 2 way combiner type, the LPA means comprises six LPAs having two LPAs corresponding to the sector signals inputted via two paths per each sector.

9. The LPA shelf according to claim 1, wherein the first LPA type conversion means is switched to either the signal dividing means or the first switch means according to the determined LPA type.

10. The LPA shelf according to claim 1, wherein the second LPA type conversion means is switched to either the signal combining means or the second switch means according to the determined LPA type.

11. A method for managing a linear power amplifier (LPA) shelf for a mobile communication base station, the method comprising:
   setting paths of at least one sector signal received according to LPA types determined by LPA installation and a number of frequency assignments (FAs);
   switching a first sector signal provided via a first path of the set paths to a corresponding LPA;
   adjusting a phase of a second sector signal so as to correspond to the first sector signal, the second sector signal being provided via a second path of the set paths;
   amplifying at least one sector signal provided via either the first path or the second path to a predetermined level;
   switching the at least one amplified sector signal;
   combining the at least one amplified sector signal according to the sectors,
   determining a current LPA type according to the LPA installation; and
   determining a to-be-changed LPA type based on the current LPA type and the number of the FAs.

12. The method according to claim 11, wherein, if the LPA type is a 1:1 type and a redundancy type, the path of the at least one sector signal is set to only the first path.

13. The method according to claim 11, wherein, if the LPA type is a 2 way combiner type, the path of the at least one sector signal is simultaneously set to the first and second paths.

14. A method for switching a linear power amplifier (LPA) type of a mobile communication base station, the method comprising:

determining a to-be-changed LPA type based on a current LPA type and a number of frequency assignments (FAs) according to open collector signals generated from each LPA; and switching the LPA type according to the determined LPA type, and wherein when the current LPA type is a redundancy type and simultaneously 3 or more FAs are required so that the redundancy type is to be switched to a 2 way combiner type, simultaneously connecting first and second paths of a signal dividing means, simultaneously connecting a second path of a first LPA type conversion means and a second path of a second LPA type conversion means, respectively, and simultaneously connecting first and second paths of a signal combining means, and when the redundancy type is switched to the 2 way combiner type, delaying a phase of a second sector signal transmitted to the second path by an amount of delayed phase caused when a first sector signal passes through first and second switch means.

15. The method according to claim 14, further comprising:

when the present LPA type is a 2 way combiner type and simultaneously 3 or less FAs are required so that the 2 way combiner type is to be switched to a redundancy type, connecting a first path of a signal dividing means and disconnecting a second path of a signal dividing means;

connecting a first path of a first LPA type conversion means and a first path of a second LPA type conversion means, respectively; and connecting a first path of a signal combining means and disconnecting a second path of a signal combining means.

16. The method according to claim 14, further comprising:

when the current type is a redundancy type and simultaneously the open collector signals are not received from a redundancy LPA so that the redundancy type is switched to a 1:1 type, connecting a first path of a signal dividing means and disconnecting a second path of a signal dividing means;

connecting a second path of a first LPA type conversion means and a second path of a second LPA type conversion means, respectively; and connecting a first path of a signal combining means and disconnecting a second path of a signal combining means.

17. The method according to claim 14, wherein the open collector signals are generated whenever each LPA is installed.

* * * * *